United States Patent
Botker

(10) Patent No.: US 8,866,554 B2
(45) Date of Patent: Oct. 21, 2014

(54) TRANSLINEAR SLEW BOOST CIRCUIT FOR OPERATIONAL AMPLIFIER

(71) Applicant: Linear Technology Corporation, Milpitas, CA (US)

(72) Inventor: Thomas Lloyd Botker, Andover, MA (US)

(73) Assignee: Linear Technology Corporation, Milpitas, CA (US)

( * ) Notice: Subject to any disclaimer, the term of this patent is extended or adjusted under 35 U.S.C. 154(b) by 85 days.

(21) Appl. No.: 13/829,807

(22) Filed: Mar. 14, 2013

(65) Prior Publication Data

US 2014/0266435 A1    Sep. 18, 2014

(51) Int. Cl.
*H03F 3/45* (2006.01)

(52) U.S. Cl.
CPC .................................. *H03F 3/45179* (2013.01)
USPC .......................................... 330/261; 330/258

(58) Field of Classification Search
CPC ......................................................... H03F 3/45
USPC ...................... 330/261, 9, 258, 254
See application file for complete search history.

(56) References Cited

U.S. PATENT DOCUMENTS

| | | | |
|---|---|---|---|
| 4,797,629 A | 1/1989 | Widlar | |
| 7,339,430 B2 * | 3/2008 | Chiu et al. | 330/253 |
| 7,863,982 B2 * | 1/2011 | Chen et al. | 330/261 |
| 8,023,911 B2 * | 9/2011 | Miyashita | 455/130 |
| 8,436,682 B1 * | 5/2013 | Parkhurst et al. | 330/261 |
| 2012/0049960 A1 * | 3/2012 | Hsu | 330/261 |

* cited by examiner

*Primary Examiner* — Henry Choe
(74) *Attorney, Agent, or Firm* — Patent Law Group LLP; Brian D Ogonowsky

(57) ABSTRACT

A method of improving the slew rate of an amplifier is described where a differential pair of transistors receives a differential first control signal and second control signal. The tail current for the transistors is provided by a tail current regulator. The same control signals are applied to a slew boost controller, whose output increases as the differential between the control signals increase. The tail current regulator generates a bias signal that sets a minimum tail current. The tail current is controlled to be the minimum tail current until the slew boost output signal exceeds a threshold, whereupon the tail current increases in response to an increasing differential between the control signals. Common mode rejection is not adversely affected by the slew boost controller generating a slightly varying current under common mode conditions due to the minimum tail current.

16 Claims, 3 Drawing Sheets

US 8,866,554 B2

TRANSLINEAR SLEW BOOST CIRCUIT FOR OPERATIONAL AMPLIFIER

FIELD OF THE INVENTION

This invention relates to operational amplifiers and, in particular, to a technique for improving the slew rate of operational amplifiers.

BACKGROUND

The entire circuit of FIG. 1 will be referred to herein as an operational amplifier. FIG. 1 illustrates a typical differential amplifier 10, comprising NPN bipolar transistors Q1 and Q2, that amplifies the differential signals Vinp and Vinn, where Vinp is designated as the non-inverted signal, and Vinn is designated as the inverted signal. The signals will typically swing between a positive rail voltage and ground or swing between positive and negative rail voltages. The total current through the respective load resistors R1 and R2 is the tail current I1. The tail current I1 is generated by a tail current transistor Q3 (an NPN bipolar transistor) receiving a fixed DC bias voltage Vbias. An operational amplifier (op amp) 16 converts the differential output of the differential amplifier 10 to a single ended output Vout and provides gain.

Slew rate is the speed (change in voltage with time) at which Vout changes when a large step function occurs between Vinp and Vinn. Compensation capacitors (e.g., capacitor 18), tail current I1, and other factors affect slew rate. One way to increase slew rate is to provide a larger tail current I1 for the amplifier 10. However, with such a large tail current stability is degraded. In the process of improving the stability, the amplifier noise, voltage offset, and voltage offset drift are often degraded.

U.S. Pat. No. 4,797,629, to Widlar, discloses a tail current circuit that varies with the differential input voltage but common mode rejection ratio (CMRR) is degraded. CMRR is degraded because, in an actual circuit, the Widlar tail current would change somewhat with common mode signals.

What is needed is a circuit that improves the slew rate of an operational amplifier while not degrading the common mode rejection ratio (CMRR), noise, voltage offset, and voltage offset drift.

SUMMARY

An operational amplifier circuit is disclosed whose tail current is a relatively low regulated minimum current for common mode input voltages, wherein the tail current increases in response to an increasing differential input voltage. In this way, the slew rate increases with increases in the differential input voltage and efficiently improves the full power bandwidth of the operational amplifier.

A slew boost controller receives the same differential input voltages applied to the differential pair of transistors and generates a variable slew current (Islew), where Islew increases along with an increasing differential input voltage.

For common mode signals, Islew will vary somewhat with the magnitude of the common mode voltage. To prevent such a variation in Islew from affecting the tail current (and reducing the CMRR), a separate tail current regulator generates a minimum bias (or reference) current (Iref) that is mirrored by the tail current transistor to keep the tail current at a constant minimum until Islew exceeds Iref. Once Islew exceeds Iref, such as when there is a sufficient differential between the input signals, the tail current is increased and controlled only by Islew and not by Iref. The size of the tail current transistor is selected to conduct a current proportional to Iref or Islew.

In one embodiment, the slew boost controller comprises a Class AB stage, where each of two current paths includes two transistors in series. The magnitude of the combined currents (Islew) conducted by the two paths is related to the input differential. If Islew is greater than the Iref level determined by the tail current regulator, Islew increases the tail current to improve the slew rate.

If the input voltages are equal (common mode), small variations in Islew generated by the Class AB stage are below Iref. Thus, the minimum tail current is not affected by the common mode component of the input voltages.

If there is a differential component and a common mode component of the input voltages Vinp and Vinn, the tail current will just be substantially related to the differential component and not the common mode component.

The slew boost controller dynamically controls the tail current in amplifiers having either differential outputs or single ended outputs.

BRIEF DESCRIPTION OF THE DRAWINGS

Elements that are the same or equivalent are labeled with the same numeral.

DETAILED DESCRIPTION

Figure 1:
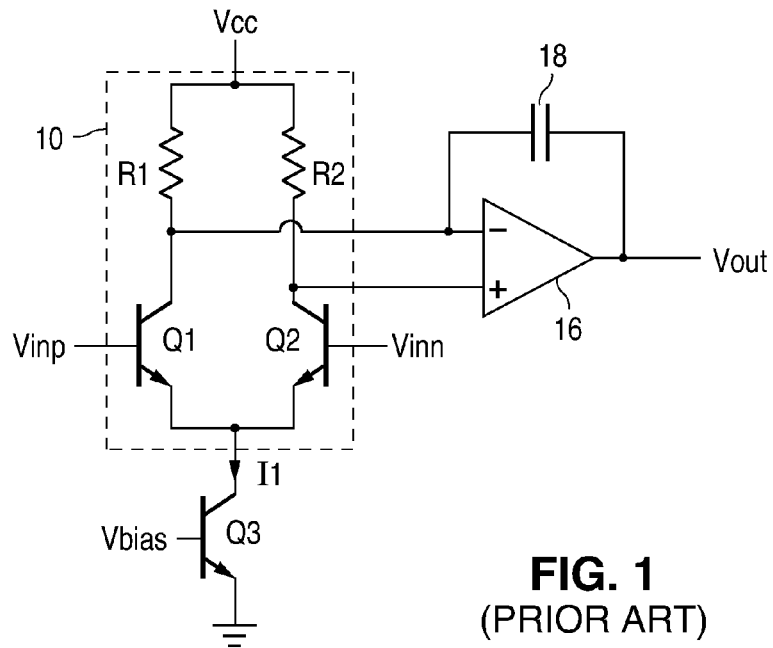
FIG. 1 illustrates a prior art operational amplifier having a differential amplifier portion.
Figure 2:
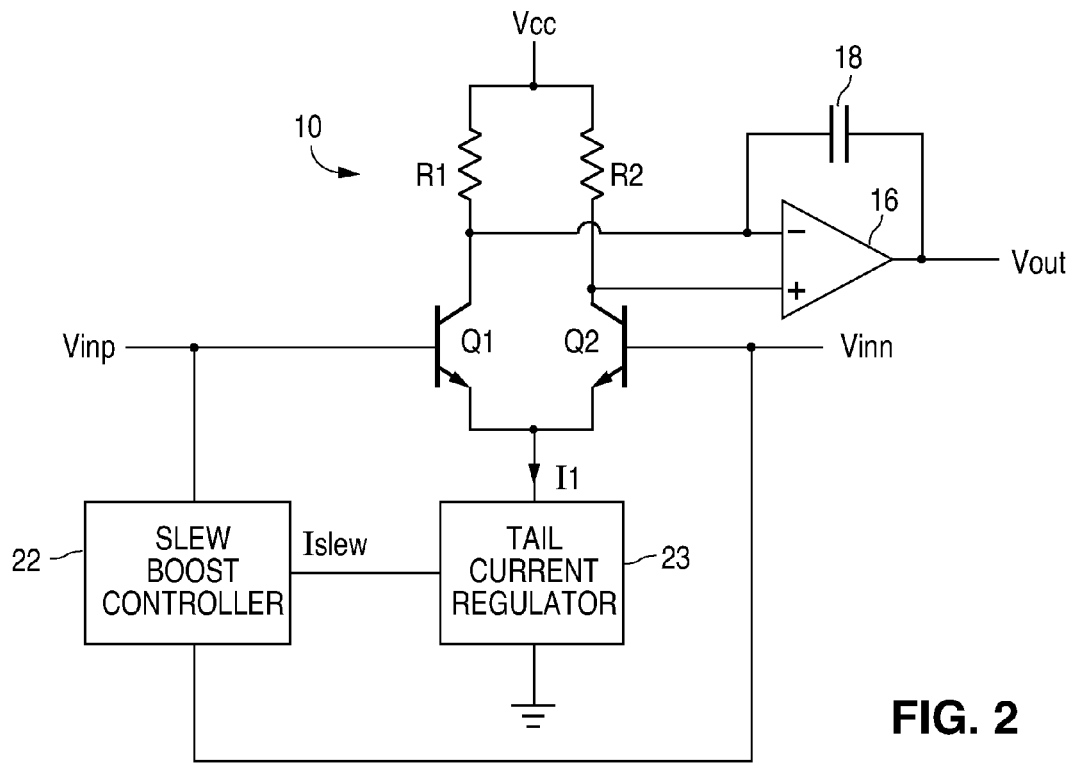
FIG. 2 illustrates the operational amplifier of FIG. 1 but with the addition of the slew boost controller and tail current regulator.

FIG. 2 illustrates one embodiment of the invention. The differential amplifier 10 of FIG. 1 is connected to a slew boost controller 22 and a tail current regulator 23. The slew boost controller 22 receives the Vinp and Vinn differential signals and generates a slew current Islew that is applied to a tail current regulator 23. The slew current Islew only affects the tail current I1 if the slew current Islew exceeds a certain level determined by the tail current regulator 23. As the absolute magnitude of the differential input voltage (ΔV) increases, the slew current Islew increases.

Figure 3:
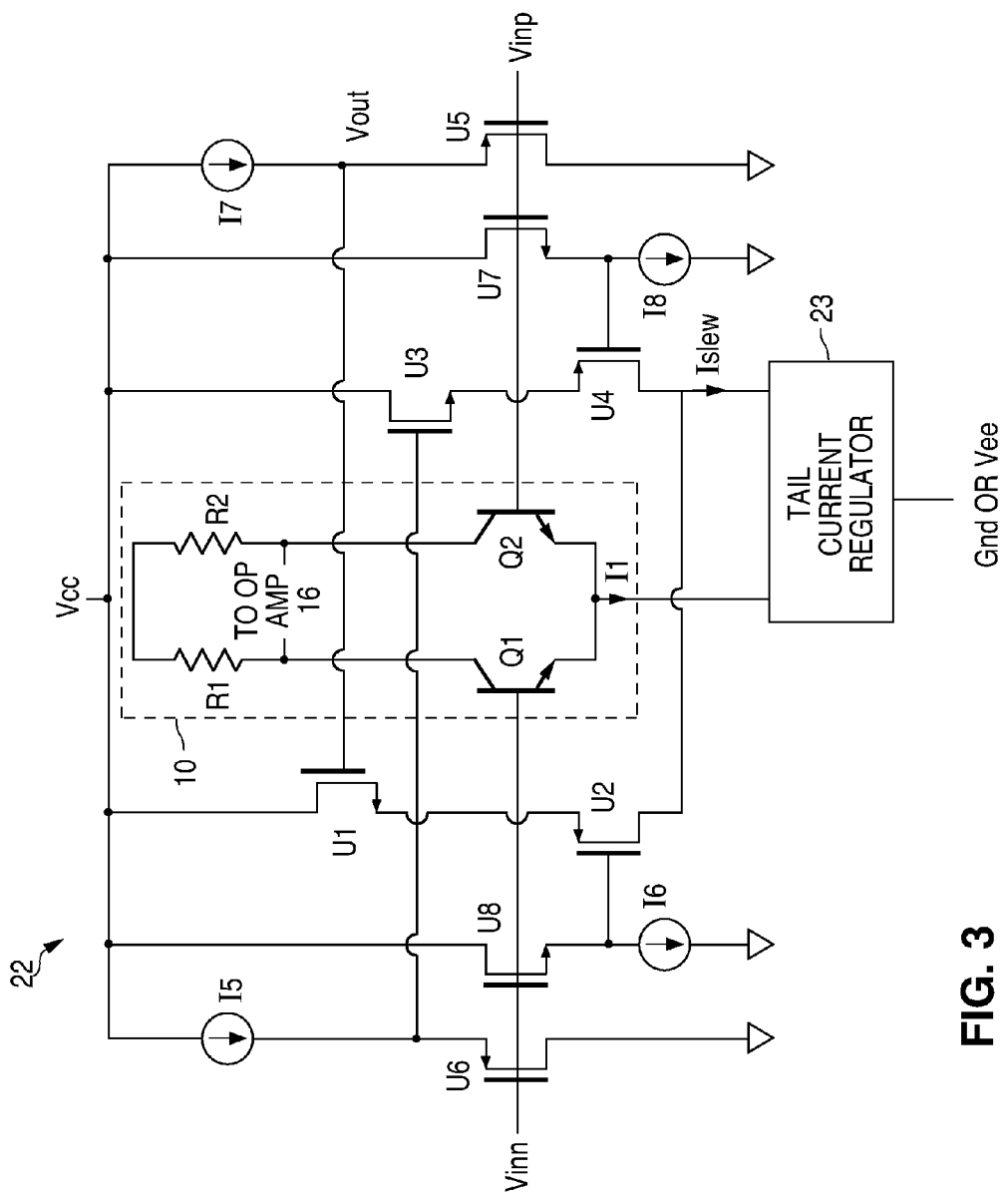
FIG. 3 illustrates the operational amplifier of FIG. 2 along with a transistor level diagram of one embodiment of the slew boost controller (a Class AB stage).
Figure 4:
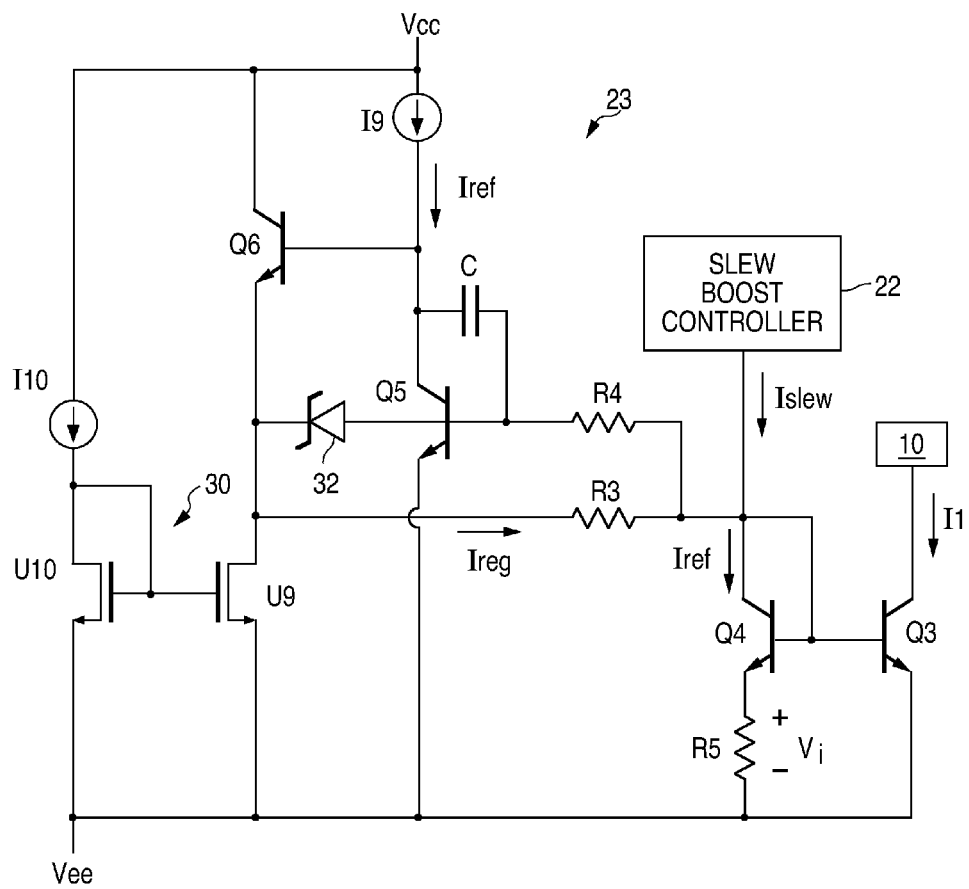
FIG. 4 is a transistor level diagram of one embodiment of the tail current regulator.

Details of the slew boost controller 22 are shown in FIG. 3, and details of the tail current regulator 23 are shown in FIG. 4.

Briefly, the tail current regulator 23 contains a current mirror that sets the current I1 through the tail current transistor Q3 (FIG. 4). The current through the current mirror is set to be a constant bias current Iref until the slew current Islew exceeds a threshold. The threshold, in one embodiment, is approximately Iref. Accordingly, the tail current I1 is set to be proportional to Iref for common mode input signals. When an input voltage differential exceeds a certain level, Islew will override the Iref minimum current and will control the tail current I1.

By increasing the tail current I1 in proportion to the absolute magnitude of the differential input voltage, the slew rate is progressively increased. Since the tail current I1 is only increased proportional to the magnitude of the differential input voltage to increase slew rate, the drawbacks of using a fixed high tail current I1 are avoided. Due to the bias current Iref overriding any small variations in slew current Islew during common mode voltages, there is no CMRR reduction.

The op amp 16 also contains a differential amplifier as an input stage, and the slew boost controller 22 current may control the tail current in that differential amplifier to similarly increase the slew rate in proportion to the magnitude of the differential input voltage.

The tail current transistor Q3 (FIG. 4) may have its emitter coupled to ground or to a negative power supply (VEE), depending on the desired voltage swings of the differential input voltages.

FIG. 3 illustrates the differential amplifier 10 of FIG. 2 along with a transistor level diagram of one embodiment of the slew boost controller 22 (a Class AB stage).

The current sources I5, I6, I7, and I8 should be matched. The Class AB stage is symmetrical, and the symmetrical transistors should be matched so that the tail current varies the same no matter which way the differential voltages swing. Similar type transistors are assumed to have the same Vgs threshold voltage.

NMOS transistor U1 and PMOS transistor U2 form one current path between Vcc (a positive power supply voltage) and the tail current regulator 23. NMOS transistor U3 and PMOS transistor U4 form a second current path between Vcc and the tail current regulator 23.

In the following example, it is assumed the differential voltage swing is the maximum, such as from 0 to 5 volts, where Vinp goes high and Vinn goes low, and where the transistors U1-U4 are substantially either on or off after the swing. For intermediate swings, the various transistors will have variable conductances, and the currents from both paths will combine to generate the slew current Islew. When Vinp goes high, the sources of transistor U5 and U7 go up. When Vinn goes low, the sources of transistors U6 and U8 go down. This causes transistors U1 and U2 to turn on and transistors U3 and U4 to turn off. Therefore, a relatively high current path is created by transistors U2 and U1 being on, since their Vgs values are well above their threshold voltage. This maximum slew current Islew is applied to the tail current regulator 23 to increase the tail current to a maximum value.

When Vinp goes low and Vinn goes high, the transistors are oppositely conductive, and the same slew boost current I2 is generated. If the voltage swings are between the maximums, some current will be generated by both current paths, and the currents are added.

The following occurs when Vinp and Vinn are equal (a common mode situation). I5, I6, I7, and I8 are ideally matched, and the transistors on both sides are ideally matched (e.g., same Vgs threshold voltage) and selected to operate as follows. The sources of transistors U1 and U2 are connected together, and the sources of transistors U3 and U4 are connected together. If Vinp and Vinn are equal, the Vgs's for the transistors U1-U4 will be balanced. Therefore, there will be an equal and small current through each of the two paths. Although this combined current Islew is ideally the same for all common mode voltages, there will be some mismatch between components and the common mode Islew may vary with the magnitude of the common mode signals. However, this low Islew is below the threshold for overriding the minimum Iref current that sets the tail current. Therefore, the tail current is unaffected by common mode voltages, and there is no degrading of the CMRR.

If there is a differential component and a common mode component of the input voltages Vinp and Vinn, Islew will substantially just be related to the differential component and not the common mode component.

FIG. 4 illustrates one embodiment of the tail current regulator 23.

The circuit of FIG. 4 regulates a bias (or reference) current Iref through transistor Q4 until Islew overrides it by exceeding a threshold, which is approximately Iref. A regulated current Ireg is generated by the tail current regulator 23 to keep Iref constant as Islew varies, such as during a common mode situation. The circuit is configured to keep the Vbe's of transistors Q5 and Q3 equal. The Vbe of transistor Q5 is set by the current source I9, which generates Iref. The base of transistor Q5 is connected to the base of transistor Q4 by a resistor R4. The emitter of transistor Q5 is connected to Vee or ground, and the emitter of transistor Q4 is connected to Vee by a small value resistor R5 so that its small voltage drop may be ignored. Resistor R5 is optional and is used to increase the current gain for the tail current I1.

If the current through transistor Q4 deviates from Iref, there will be a difference between the base voltages (Vb's) of transistors Q4 and Q5, and a current will flow through resistor R4. If the Vb of transistor Q4 is less than the Vb of transistor Q5, the current through resistor R4 causes transistor Q6 to conduct more and supply the current Ireg through the resistor R3 needed to keep transistor Q4 conducting Iref so as to equalize the Vb's of transistors Q4 and Q5. Ireg is adjusted to cause no current to flow through the resistor R4, assuming the base current of transistor Q5 is negligible. Current source I10 and transistors U9 and U10 form a current mirror which sets up the bias current through the transistor Q6.

The capacitor C, in conjunction with resistor R4, acts as an integrator for compensation to improve stability. Transistor Q5 is prevented from going into saturation by the Schottky diode 32 during slewing.

In this manner, Iref through transistor Q4 is controlled to be constant (and equal to the current generated by the current source I9) despite small variations in Islew, where, Iref=Ireg+Islew, as long as Islew remains below Iref.

Since transistors Q3 and Q4 are connected as current mirrors, the tail current through transistor Q3 is proportional to the current through transistor Q4.

Since there is some small voltage drop across resistor R5, the area of transistor Q4 is made larger than transistor Q5, allowing the base voltages of transistors Q4 and Q5 to be the same with the same current flowing through them.

As long as Islew is less than Iref (Ireg>0), a constant minimum tail current will result. The tail current will depend on the relative sizes of transistors Q5 and Q3.

Once Islew exceeds Iref, the tail current regulator 23 (generating Ireg) can no longer regulate Iref, and the current through transistor Q4 is determined by Islew. Accordingly, the tail current I1 becomes proportional to Islew.

There are many other circuits that can be used to carry out the functions of the slew boost controller 22 and tail current regulator 23. An all CMOS circuit is envisioned as well as an all bipolar circuit. Each PMOS transistor may be replaced with a PNP bipolar transistor. Each NMOS transistor may be replaced with an NPN bipolar transistor. Each transistor in the various figures may be opposite types depending on the power supply voltage polarities.

The slew boost controller 22 may also provide a variable tail current in the differential amplifier within the op amp 16 to increase its slew rate.

While particular embodiments of the present invention have been shown and described, it will be obvious to those skilled in the art that changes and modifications may be made without departing from this invention in its broader aspects.

The appended claims are to encompass within their scope all such changes and modifications as fall within the true spirit and scope of this invention.

What is claimed is:

1. An amplifier circuit with improved slew rate comprising:
a differential pair of transistors comprising a first transistor and a second transistor, the first transistor having a first control terminal, for receiving a first control signal, a first current handling terminal, and a second current handing terminal, the second transistor having a second control terminal, for receiving a second control signal, a third current handling terminal, and a fourth current handing terminal, the first current handling terminal and the third current handling terminal being coupled to a common tail current source,
the tail current source providing a tail current for the differential pair of transistors;
a slew boost controller having a first output terminal coupled to the tail current source, the slew boost controller having a fourth control terminal, for receiving the first control signal, and a fifth control terminal, for receiving the second control signal, the slew boost controller generating a slew boost output signal at the first output terminal corresponding to a difference between the first control signal and the second control signal; and
a tail current regulator coupled to the first output terminal of the slew boost controller, the tail current regulator generating a bias signal for controlling the tail current source to output a minimum tail current,
wherein the tail current regulator controls the tail current to be a minimum tail current until the slew boost output signal exceeds a threshold, whereupon the slew boost output signal increases the tail current in response to an increasing differential between the first control signal and the second control signal for improving the slew rate of the amplifier.

2. The circuit of claim 1 wherein the tail current source is a third transistor.

3. The circuit of claim 2 wherein the tail current source comprises a bipolar transistor.

4. The circuit of claim 2 wherein the tail current regulator generates a bias current that sets a minimum current through the third transistor, and wherein the slew boost controller increases the current through the third transistor once the differential between the first control signal and the second control signal has exceeded a certain threshold magnitude.

5. The circuit of claim 1 wherein the slew boost controller comprises a Class AB stage having a first current path that conducts an increasing current as the first control signal rises above the second control signal and having a second current path that conducts an increasing current as the second control signal rises above the first control signal, wherein combined currents through the first current path and the second current path are provided at the first output terminal of the slew boost controller.

6. The circuit of claim 1 wherein the tail current regulator incorporates a feedback loop to set a bias signal for setting the minimum tail current.

7. The circuit of claim 1 further comprising a first load, coupled between the second current handling terminal of the first transistor and a power supply terminal, and a second load, coupled between the fourth current handling terminal of the second transistor and the power supply terminal, an output of the differential pair of transistors being a differential voltage between the second current handling terminal and the fourth current handling terminal.

8. The circuit of claim 7 further comprising an operational amplifier receiving the output of the differential pair of transistors, the operational amplifier comprising an additional differential pair of transistors coupled to an additional tail current source, a current conducted by the additional tail current source being controlled by the slew boost controller to improve a slew rate of the operational amplifier.

9. A method of improving the slew rate of an amplifier including a differential pair of transistors comprising:
receiving a differential first control signal at a first control terminal of a first transistor;
receiving a differential second control signal at a second control terminal of a second transistor, the first transistor and the second transistor forming a differential pair of transistors, the first transistor having a first current handling terminal and a second current handling terminal, the second transistor having a third current handling terminal and a fourth current handling terminal, the first current handling terminal and the third current handling terminal being coupled to a common tail current source, the tail current source providing a tail current for the differential pair of transistors;
receiving the differential first control signal at a fourth control terminal of a slew boost controller;
receiving the differential second control signal at a fifth control terminal of the slew boost controller;
generating a slew boost output signal, by the slew boost controller, at a first output terminal of the slew boost controller corresponding to a difference between the first control signal and the second control signal;
generating a bias signal, by a tail current regulator;
coupling the tail current regulator to the first output terminal of the slew boost controller, the tail current regulator controlling the tail current source to output a minimum tail current; and
controlling the tail current by the tail current regulator to be a minimum tail current until the slew boost output signal exceeds a threshold, whereupon the slew boost output signal increases the tail current in response to an increasing differential between the first control signal and the second control signal for improving the slew rate of the amplifier.

10. The method of claim 9 wherein the tail current source comprises a third transistor.

11. The method of claim 10 wherein the first output terminal of the slew boost controller is coupled to a current mirror circuit comprising the third transistor.

12. The method of claim 11 wherein the step of generating a bias signal comprises the tail current regulator generating a bias signal that adds to the slew boost output signal, where the sum is applied to the current mirror circuit, and
wherein the step of controlling the tail current comprises the slew boost controller generating a current greater than the threshold to increase the current through the third bipolar transistor once the differential between the first control signal and the second control signal has exceeded a threshold magnitude.

13. The method of claim 9 wherein the slew boost controller comprises a Class AB stage having a first current path that conducts an increasing current as the first control signal rises above the second control signal and having a second current path that conducts an increasing current as the second control signal rises above the first control signal, wherein combined currents through the first current path and the second current path are provided at the first output terminal of the slew boost controller.

14. The method of claim 9 wherein the step of generating a bias signal comprises the tail current regulator using a feedback loop to set the minimum tail current.

15. The method of claim 9 wherein a first load is coupled between the second current handling terminal of the first transistor and a power supply terminal, and wherein a second load is coupled between the fourth current handling terminal of the second transistor and the power supply terminal, wherein an output of the differential pair of transistors is a differential voltage between the second current handling terminal and the fourth current handling terminal.

16. The method of claim 15 further comprising an operational amplifier receiving the output of the differential pair of transistors, the operational amplifier comprising an additional differential pair of transistors coupled to an additional tail current source, the method further comprising the slew boost controller controlling a current conducted by the additional tail current source to improve a slew rate of the operational amplifier.

\* \* \* \* \*